(12) United States Patent
Matsuzaki (10) Patent No.: US 10,847,403 B2
(45) Date of Patent: Nov. 24, 2020

(54) METHOD OF MANUFACTURING DEVICE CHIPS AND PICK UP APPARATUS

(71) Applicant: DISCO CORPORATION, Tokyo (JP)

(72) Inventor: Sakae Matsuzaki, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 27 days.

(21) Appl. No.: 16/210,139

(22) Filed: Dec. 5, 2018

(65) Prior Publication Data

US 2019/0181029 A1 Jun. 13, 2019

(30) Foreign Application Priority Data

Dec. 12, 2017 (JP) .................................. 2017-237382

(51) Int. Cl.
```
H01L 21/78      (2006.01)
H01L 21/683     (2006.01)
H01L 21/67      (2006.01)
H01L 21/687     (2006.01)
```

(52) U.S. Cl.
CPC .... *H01L 21/6833* (2013.01); *H01L 21/67132* (2013.01); *H01L 21/6835* (2013.01); *H01L 21/68728* (2013.01); *H01L 21/78* (2013.01); *H01L 21/6838* (2013.01); *H01L 2221/68322* (2013.01); *H01L 2221/68327* (2013.01)

(58) Field of Classification Search
None
See application file for complete search history.

(56) References Cited

U.S. PATENT DOCUMENTS

| | | | | |
|---|---|---|---|---|
| 2006/0163224 A1* | 7/2006 | Takeda | ............... | B23K 37/0435 219/121.82 |
| 2013/0302969 A1* | 11/2013 | Priewasser | .............. | H01L 21/82 438/458 |
| 2015/0044857 A1* | 2/2015 | Matsuzaki | ........ | H01L 21/02076 438/463 |
| 2015/0364375 A1* | 12/2015 | Nakamura | ............ | H01L 21/268 438/462 |
| 2016/0064198 A1* | 3/2016 | Okita | ................ | H01J 37/32697 216/45 |

FOREIGN PATENT DOCUMENTS

| | | |
|---|---|---|
| JP | 09027543 A | 1/1997 |
| JP | 2012084720 A | 4/2012 |

* cited by examiner

*Primary Examiner* — Selim U Ahmed
(74) *Attorney, Agent, or Firm* — Greer Burns & Crain Ltd.

(57) ABSTRACT

A method of manufacturing device chips includes the steps of placing a workpiece on a table with a sheet of an insulating material being interposed between the table and the workpiece, attracting the sheet to the workpiece under electrostatic forces by applying a voltage between electrodes in the table to polarize the workpiece and the sheet, unloading the workpiece with the sheet attracted thereto from the table, processing the workpiece with the sheet attracted thereto to divide the workpiece into a plurality of device chips that correspond respectively to devices, and peeling off the device chips from the sheet by bringing an electrically conductive probe into contact with one, at a time, of areas of the sheet that correspond respectively to the device chips and applying a voltage to the probe thereby to release the sheet from the device chips that have attracted the sheet.

4 Claims, 10 Drawing Sheets

METHOD OF MANUFACTURING DEVICE CHIPS AND PICK UP APPARATUS

BACKGROUND OF THE INVENTION

Field of the Invention

The present invention relates to a method of manufacturing a plurality of device chips by processing a workpiece such as a semiconductor wafer, and a pickup apparatus for use in the method of manufacturing a plurality of device chips.

Description of the Related Art

For processing a plate-shaped workpiece, typically a semiconductor wafer or a packaged substrate, to divide it into a plurality of device chips, there is used a processing apparatus such as a cutting apparatus having an annular cutting blade and a laser processing apparatus having a laser oscillator. While the cutting blade that is rotating about its own axis is cutting into the workpiece or a laser beam is being applied to the workpiece, the workpiece is moved along a path. The workpiece is thus processed along the path by the cutting blade or the laser beam, and divided into a plurality of device chips (see, for example, Japanese Patent Laid-open No. 2012-84720).

Before the workpiece is processed by the processing apparatus, an adhesive tape or dicing tape that is larger in diameter than the workpiece is stuck to the workpiece, and an annular frame is fixed to an outer peripheral portion of the adhesive tape. The adhesive tape and the annular frame are effective to protect the workpiece from impacts that might be applied to the workpiece when the workpiece is processed or delivered. Furthermore, since the adhesive tape prevents the device chips divided from the workpiece from being scattered around, the device chips can easily be delivered (see, for example, Japanese Patent Laid-open No. Hei 9-27543).

SUMMARY OF THE INVENTION

The adhesive tape that is stuck to the workpiece contains an adhesive whose adhesive power is strong enough to keep the workpiece secure in position against unwanted displacement while the workpiece is being processed. Therefore, after the workpiece has been divided into the device chips, for example, the device chips may not easily be peeled off the adhesive tape. Furthermore, since the adhesive tape cannot be reused, the cost associated with the adhesive tape may not necessarily be sufficiently low compared with the total cost required to manufacture the device chips.

It is therefore an object of the present invention to provide a method of manufacturing a plurality of device chips by processing a workpiece without using a existing adhesive tape, and a pickup apparatus for use in the method of manufacturing a plurality of device chips.

In accordance with an aspect of the present invention, there is provided a method of manufacturing a plurality of device chips by dividing a workpiece that includes a substrate made of an insulating material or a semiconductor material and has a face side demarcated into a plurality of areas by a grid of projected dicing lines and a plurality of devices disposed respectively in the areas, including the steps of placing the workpiece on a table having a holding surface with a pair of electrodes disposed therein that are spaced from each other along in-plane directions, with a sheet of an insulating material being interposed between the workpiece and the table, thereafter, attracting the sheet to the workpiece under electrostatic forces by applying a voltage between the electrodes in the table to polarize the sheet and the workpiece, thereafter, unloading the workpiece with the sheet attracted thereto from the table, thereafter, processing the workpiece with the sheet attracted thereto to divide the workpiece into a plurality of device chips that correspond respectively to the devices, and thereafter, peeling off the device chips from the sheet by bringing an electrically conductive probe into contact with one, at a time, of areas of the sheet that correspond respectively to the device chips and applying a voltage to the probe thereby to release the sheet from the device chips that have attracted the sheet, wherein the step of placing the workpiece on a table includes the step of placing the areas of the workpiece that correspond respectively to the devices over an area of the holding surface where the pair of electrodes coexist.

According to the aspect of the present invention, the step of peeling off the device chips from the sheet should preferably include the steps of applying one of positive and negative voltages to the probe to change the polarization of the sheet and the device chip, and thereafter applying the other of the positive and negative voltages to the probe to reverse the polarization of the sheet thereby to release the sheet from the device chips that have attracted the sheet.

According to the aspect of the present invention, the step of processing the workpiece may further include the steps of applying a laser beam having a wavelength transmittable through the substrate to the substrate to form modified layers in the substrate along the projected dicing lines, and thereafter expanding the sheet to break the workpiece from the modified layers serving as rupture initiating points thereby to divide the workpiece into the device chips.

According to an aspect of the present invention, there is also provided a pickup apparatus for picking up a device chip from a sheet of an insulating material that has attracted the device chip under electrostatic forces, including a fixing unit fixing the sheet in position, an electrically conductive probe contacting an area of the sheet that corresponds to the device chip, a voltage applying unit applying a voltage to the probe, and a pickup tool for picking up the device chip in timed relation to the application of the voltage to the probe that has contacted the sheet.

In the method of manufacturing a plurality of device chips according to the aspect of the present invention, the workpiece is placed on the table having the holding surface that includes the pair of electrodes spaced from each other along in-plane directions, with the insulative sheet being interposed between the workpiece and the table, and thereafter a voltage is applied to the electrodes, polarizing the sheet and the workpiece. The sheet is now attracted to the workpiece under electrostatic forces. Therefore, the workpiece can be processed without using the existing adhesive tape to stick the sheet to the workpiece.

In the method of manufacturing a plurality of device chips according to the aspect of the present invention, furthermore, inasmuch as the area of the workpiece that corresponds to each of the devices is disposed over the area of the holding surface of the polarizing table where the pair of electrodes coexist, when a voltage is applied to the pair of electrodes, the sheet is firmly attracted to the area of the workpiece that corresponds to each of the devices. Therefore, each of the device chips is not easily peeled off from the sheet when the workpiece is divided into the device chips or after the workpiece has been divided into the device chips.

In the method of manufacturing a plurality of device chips according to the aspect of the present invention, moreover, when each of the device chips is to be peeled off from the sheet, the electrically conductive probe is brought into contact with the area of the sheet that corresponds to the device chip, and a voltage is applied to the probe to cancel the electrostatic attraction between the device chip and the sheet. Therefore, the sheet can be released from the device chip when necessary, so that the device chip can easily be peeled off from the sheet.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

A method of manufacturing a plurality of device chips according to an embodiment of the present invention will be described below with reference to the accompanying drawings. The method of manufacturing a plurality of device chips according to the present embodiment includes a placing step (see FIG. 3), an attracting step (see FIGS. 4A and 4B), an unloading step (see FIG. 5), a dividing step (see FIGS. 6, 7A, and 7B), and a peeling step (see FIGS. 8, 9A, 9B, 9C, and 10).

In the placing step, a workpiece to be divided into a plurality of device chips is placed onto a table having a holding surface that includes a pair of electrodes disposed therein with a sheet of an insulative material interposed between the workpiece and the table. In the attracting step, a voltage is applied between the electrodes of the table to polarize the sheet and the workpiece, attracting the sheet to the workpiece under electrostatic forces. In the unloading step, the workpiece with the sheet attracted thereto is unloaded from the table. In the dividing step, the workpiece with the sheet attracted thereto is processed to divide itself into a plurality of device chips. In the peeling step, an electrically conductive probe is held in contact with one, at a time, of the areas of the sheet that correspond respectively to the device chips, and applies a voltage to the area to release the sheet from the corresponding device chip that has attracted the sheet, thereby peeling off the device chip from the sheet. These steps of the method of manufacturing a plurality of device chips according to the present embodiment will be described in detail below.

Figure 1:
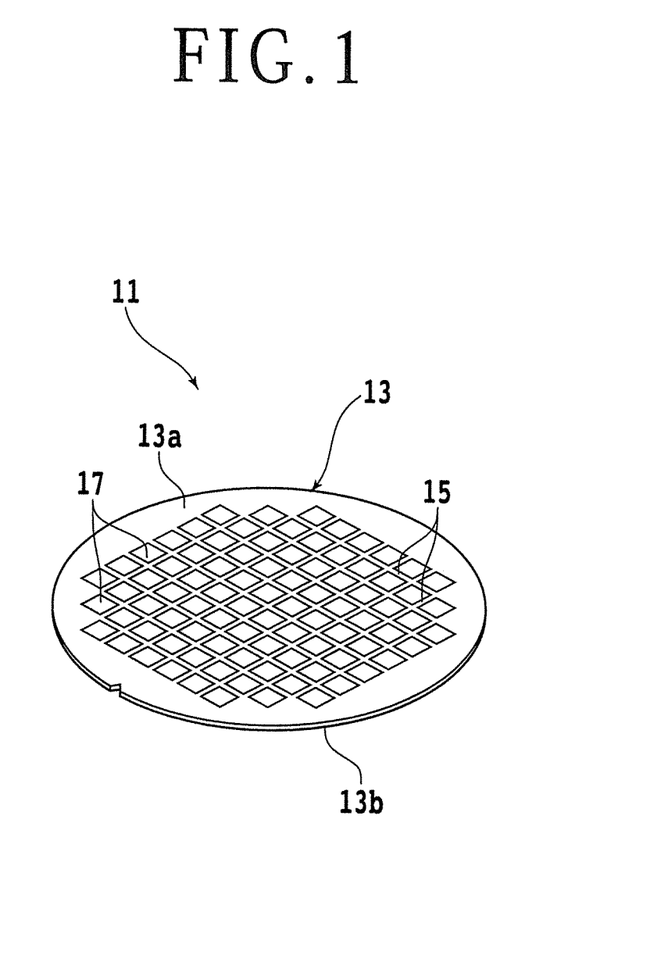
FIG. 1 is a perspective view of a workpiece to be processed by a method of manufacturing a plurality of device chips according to an embodiment of the present invention.

FIG. 1 is a perspective view of a workpiece 11 to be processed by a method of manufacturing a plurality of device chips according to the present embodiment. As depicted in FIG. 1, the workpiece 11 includes a disk-shaped wafer made of a material such as silicon as a substrate 13. The substrate 13 has a face side 13a demarcated into a plurality of areas by a grid of projected dicing lines or streets 15. A plurality of devices 17 such as integrated circuits (ICs) are disposed respectively in the areas of the face side 13a.

The substrate 13, which is included as a disk-shaped wafer made of a material such as silicon in the workpiece 11, should at least be made of a semiconductor material or an insulating material. In other words, insofar as the substrate 13 is made of a semiconductor material or an insulating material, it is not limited to any shape, structure, size, and so on. Furthermore, the devices 17 are not limited to any kind, number, shape, structure, size, layout, and so on.

Figure 2:
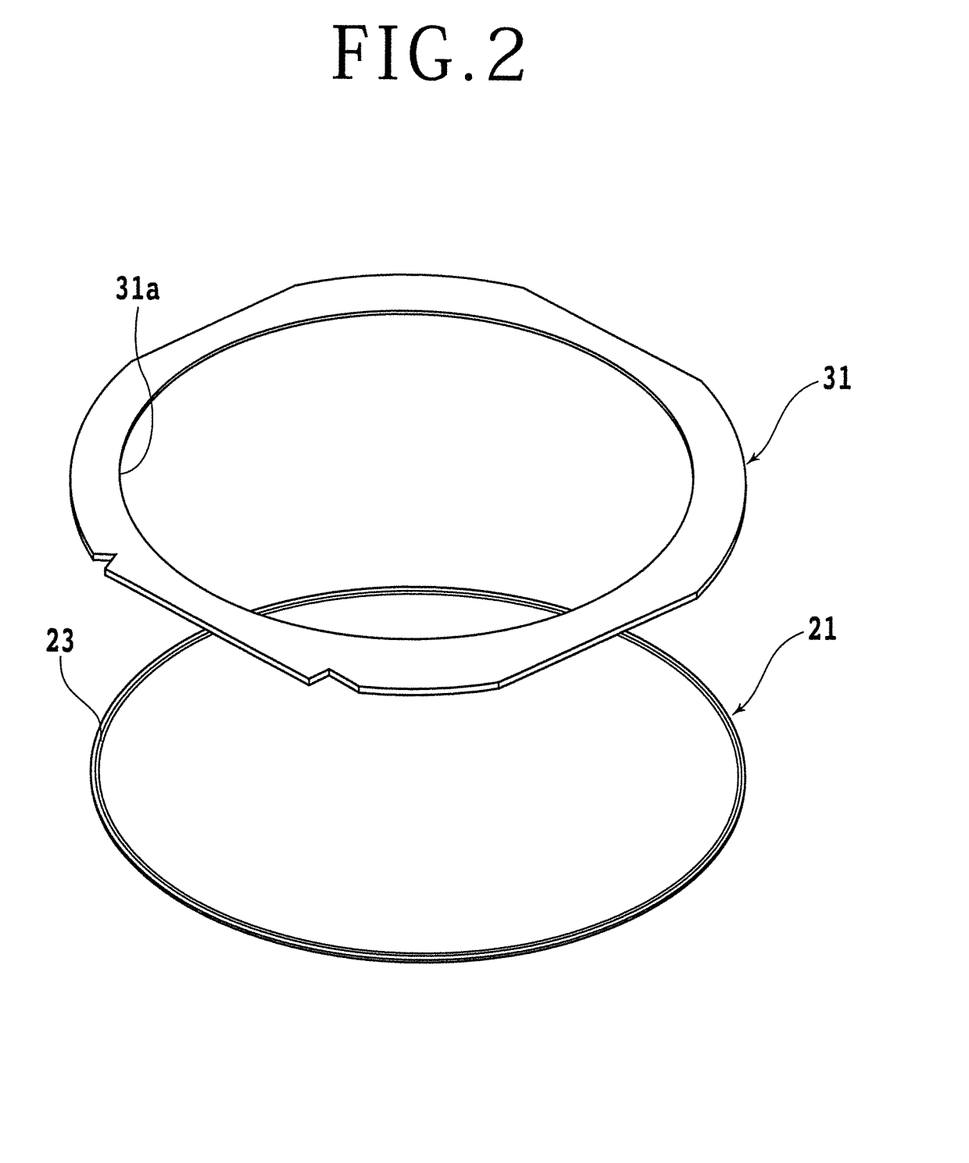
FIG. 2 is a perspective view of a sheet and an annular frame to be used with the workpiece.

FIG. 2 is a perspective view of a sheet 21 and an annular frame 31 to be used with the workpiece 11 according to the present embodiment. The sheet 21 is in the form of a circular film that is larger in diameter than the workpiece 11, for example. The sheet 21 is made of a synthetic resin such as nylon, polyethylene, polyvinyl chloride and silicone. The sheet 21 should at least be made of an insulating material. The sheet 21 is free of an adhesive later with adhesive power.

The sheet 21 should preferably have a thickness of 100 μm or smaller in order that it can be attracted to the workpiece 11 in the attracting step. If the sheet 21 is thicker than the above thickness, it is difficult to polarize the workpiece 11 through the sheet 21. The sheet 21 is not limited to any shape, structure, size, and so on.

According to the present embodiment, a film made of an elastic material is used as the sheet 21. As the sheet 21 is free of an adhesive later with adhesive power, as described above, the cost associated with the sheet 21 is relatively low. In addition, the cost associated with the sheet 21 is further low by repeatedly using the sheet 21.

The annular frame 31 is made of a material such as stainless steel and aluminum and has an opening 31a defined therein that is larger in diameter than the workpiece 11. The annular frame 31 is fixed to an outer circumferential edge portion of the sheet 21 by an adhesive 23. The frame 31 is not limited to any material, shape, structure, size, and so on. The frame 31 may, for example, be of the type in which it includes an inner ring and an outer ring and the outer circumferential edge portion of the sheet 21 is sandwiched and secured in place between the inner and outer rings. The frame 31 of this type does not require the adhesive 23 to be used.

In addition, the frame 31 may be made of an insulating material such as synthetic resin. If the frame 31 is made of an insulating material, when the sheet 21 is attracted to the workpiece 11 in the attracting step to be described later, the sheet 21 can also be attracted and secured to the frame 31. The frame 31 that is made of an insulating material does not require the adhesive 23 to be used either.

Figure 3:
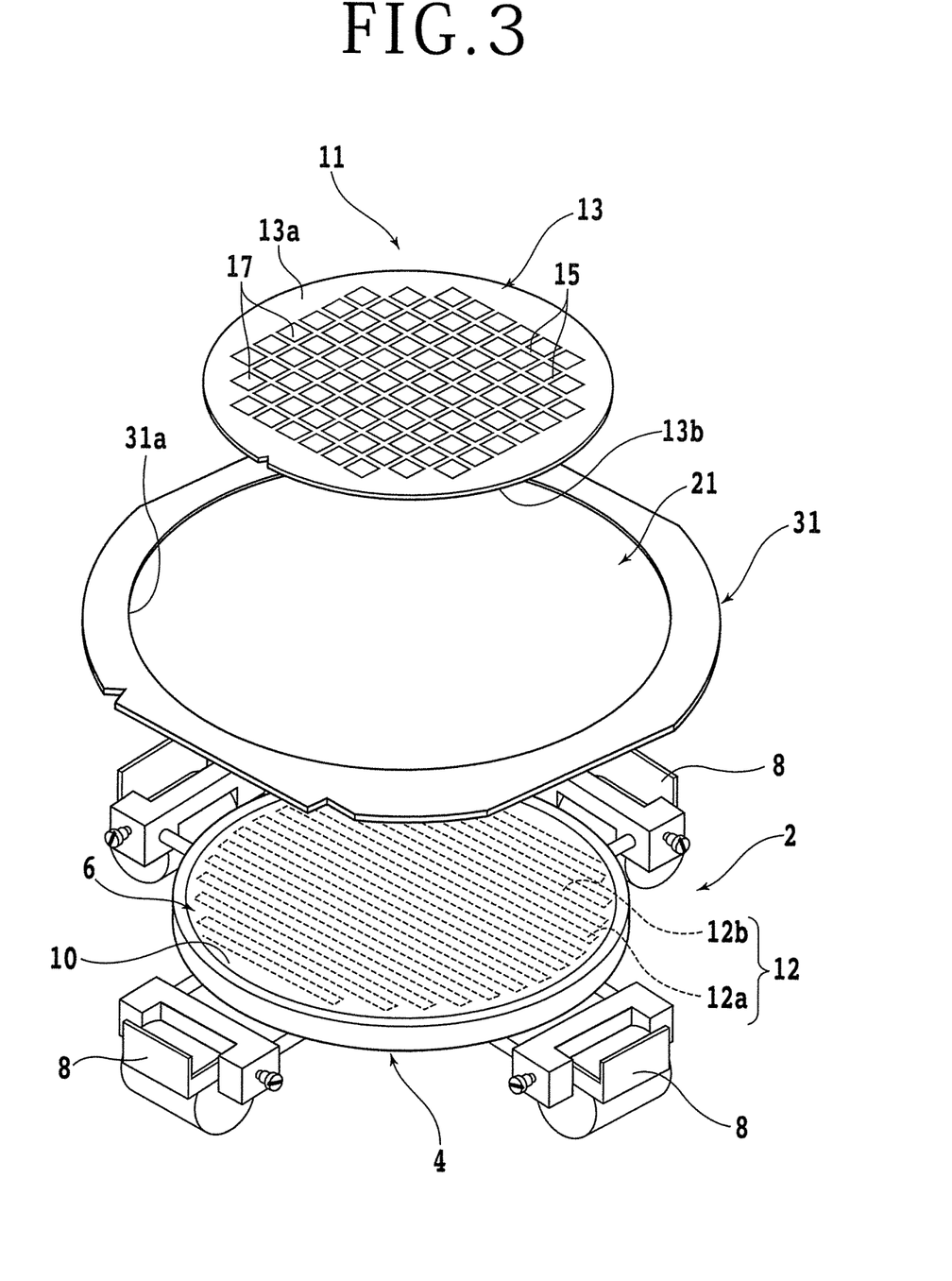
FIG. 3 is a perspective view illustrating a placing step of the method.

In the method of manufacturing a plurality of device chips according to the present embodiment, the placing step is initially performed to place the workpiece 11 and the frame 31 onto a polarizing table having a holding surface that includes a pair of electrodes, via the sheet 21. FIG. 3 is a perspective view illustrating the placing step.

As illustrated in FIG. 3, the polarizing table, denoted by 2, includes a disk-shaped frame 4 made of a material such as stainless steel, for example. A polarizing plate 6 that defines the holding surface of the polarizing table 2 is disposed centrally on an upper surface of the frame 4. A plurality of clamps 8 for fixing the frame 31 and the outer circumferential edge portion of the sheet 21 in position are disposed around the frame 4.

The polarizing plate 6 includes a substantially circular insulative base 10 made of a material such as polyethylene, a polyethylene terephthalate, for example. The base 10 is larger in diameter than the workpiece 11, for example. The base 10 is not limited to any material, shape, thickness, size, and so on.

The base 10 includes an electrode layer 12 disposed therein. The electrode layer 12 is produced by separating an electrically conductive layer parallel to a face side of the base 10 that serves as the holding surface, into a first electrode pattern or electrode 12a and a second electrode pattern or electrode 12b that are spaced from each other along in-plane directions in the base 10. The electrode layer 12, i.e., electrically conductive layer is made of an electrically conductive material that may be a material that is transparent in a visible range, such as indium tin oxide (ITO). However, the electrically conductive material of the electrode layer 12, i.e., electrically conductive layer is not limited to any material.

The electrically conductive layer may be separated into the first electrode pattern 12a and the second electrode pattern 12b by an ablation process using a laser beam, for example. Alternatively, the electrically conductive layer may be separated into the first electrode pattern 12a and the second electrode pattern 12b by an etching process or the like. Further alternatively, the electrically conductive layer that has been separated into the first electrode pattern 12a and the second electrode pattern 12b may be formed by a screen printing process, an ink jet printing process, or the like.

According to the present embodiment, the electrode layer 12 is formed such that both the first electrode pattern 12a and the second electrode pattern 12b are disposed directly below each of the devices 17 on the workpiece 11 placed on the holding surface. For example, as depicted in FIG. 3, the first electrode pattern 12a and the second electrode pattern 12b are in the form of comb teeth disposed in such an interdigitating configuration that the comb teeth have a repetitive period smaller than the interval between adjacent ones of the projected dicing lines 15 on the workpiece 11.

In the placing step, a central portion of the sheet 21 fixed to the frame 31 is brought into contact with the holding surface, i.e., the polarizing plate 6, of the polarizing table 2.

In addition, the clamps 8 are turned to secure the frame 31 in position. The workpiece 11 is then placed on the upper surface of the sheet 21 such that the devices 17, or the face side 13a of the substrate 13, are exposed upwardly. In other words, the workpiece 11 is placed on the holding surface of the polarizing table 2 with the insulative sheet 21 interposed therebetween.

At this time, the position of the workpiece 11 with respect to the polarizing table 2 is adjusted such that both the first electrode pattern 12a and the second electrode pattern 12b are disposed directly below each of the devices 17. In other words, the workpiece 11 is placed on the sheet 21 such that an area of the workpiece 11 that corresponds to each of the devices 17 is disposed over an area of the holding surface of the polarizing table 2 where both the first electrode pattern 12a and the second electrode pattern 12b coexist.

In this manner, both an electric field that will be generated by the first electrode pattern 12a and an electric field that will be generated by the second electrode pattern 12b can intensively act on an area of the workpiece 11 that corresponds to each of the devices 17. As a result, the sheet 21 can firmly be attracted to an area of the workpiece 11 that corresponds to each of the devices 17.

Figure 4A:
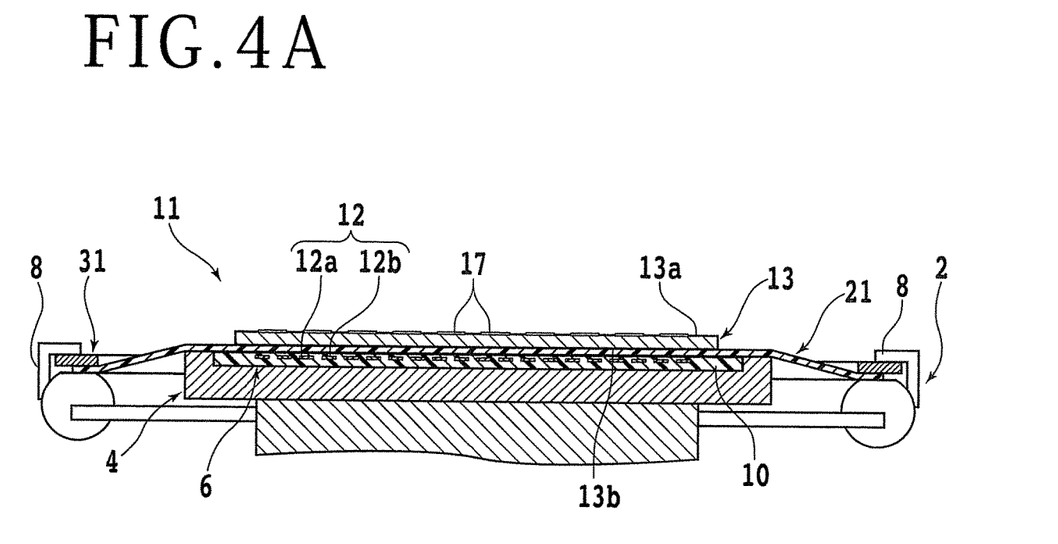
FIG. 4A is a side elevational view, partly in cross section, illustrating an attracting step of the method.
Figure 4B:
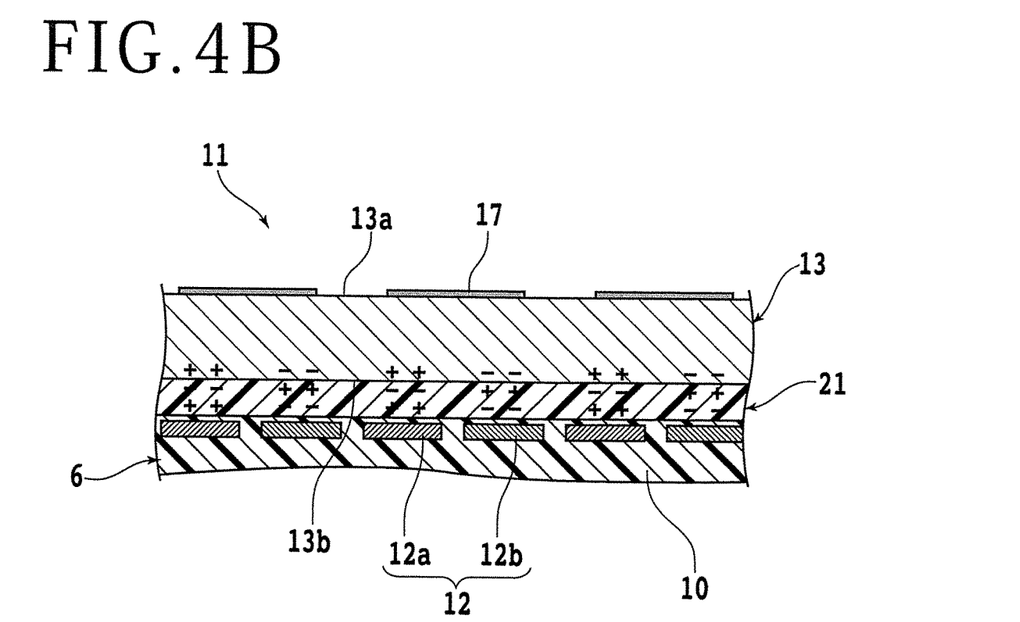
FIG. 4B is an enlarged fragmentary cross-sectional view of a portion of the assembly illustrated in FIG. 4A.

The placing step is followed by the attracting step that attracts the sheet 21 to the workpiece 11 under electrostatic forces. FIG. 4A is a side elevational view, partly in cross section, illustrating the attracting step, and FIG. 4B is an enlarged fragmentary cross-sectional view of a portion of the assembly illustrated in FIG. 4A. In the attracting step according to the present embodiment, a negative voltage is applied to the first electrode pattern 12a and a positive voltage is applied to the second electrode pattern 12b.

The magnitudes of the voltages applied to the first electrode pattern 12a and the second electrode pattern 12b, the periods of time during which the voltages are applied to the first electrode pattern 12a and the second electrode pattern 12b, and other parameters are adjusted to appropriate values depending on the material, thickness, etc. of the sheet 21. As a consequence, the sheet 21 is polarized to cancel out the effects of the negative voltage applied to the first electrode pattern 12a and the positive voltage applied to the second electrode pattern 12b.

Specifically, as illustrated in FIGS. 4A and 4B, in a region above the first electrode pattern 12a, the sheet 21 is polarized to develop positive poles therein near a lower surface thereof and negative poles therein near an upper surface thereof. On the other hand, in a region above the second electrode pattern 12b, the sheet 21 is polarized to develop negative poles therein near the lower surface thereof and positive poles therein near the upper surface thereof.

The substrate 13 of the workpiece 11 is also polarized to cancel out the effects of the poles developed in the sheet 21. Specifically, as illustrated in FIGS. 4A and 4B, in a region above the first electrode pattern 12a, the substrate 13 is polarized to develop positive poles therein near a lower surface thereof. On the other hand, in a region above the second electrode pattern 12b, the substrate 13 is polarized to develop negative poles therein near the lower surface thereof.

When the above poles are developed in the substrate 13 and the sheet 21, the substrate 13 and the sheet 21 are attracted to each other under electrostatic forces. Specifically, in the region above the first electrode pattern 12a, the sheet 21 is attracted to the workpiece 11 under attractive forces acting between positive electric charges in the substrate 13 near the lower surface thereof and negative electric charges in the sheet 21 near the upper surface thereof. On the other hand, in the region above the second electrode pattern 12*b*, the sheet 21 is attracted to the workpiece 11 under attractive forces acting between negative electric charges in the substrate 13 near the lower surface thereof and positive electric charges in the sheet 21 near the upper surface thereof.

According to the present embodiment, the negative voltage is applied to the first electrode pattern 12*a* and the positive voltage is applied to the second electrode pattern 12*b*, as described above. However, a positive voltage may be applied to the first electrode pattern 12*a* and a negative voltage may be applied to the second electrode pattern 12*b*. According to such an alternative, the polarities of the poles developed in the substrate 13 and the sheet 21 are vertically reversed.

Figure 5:
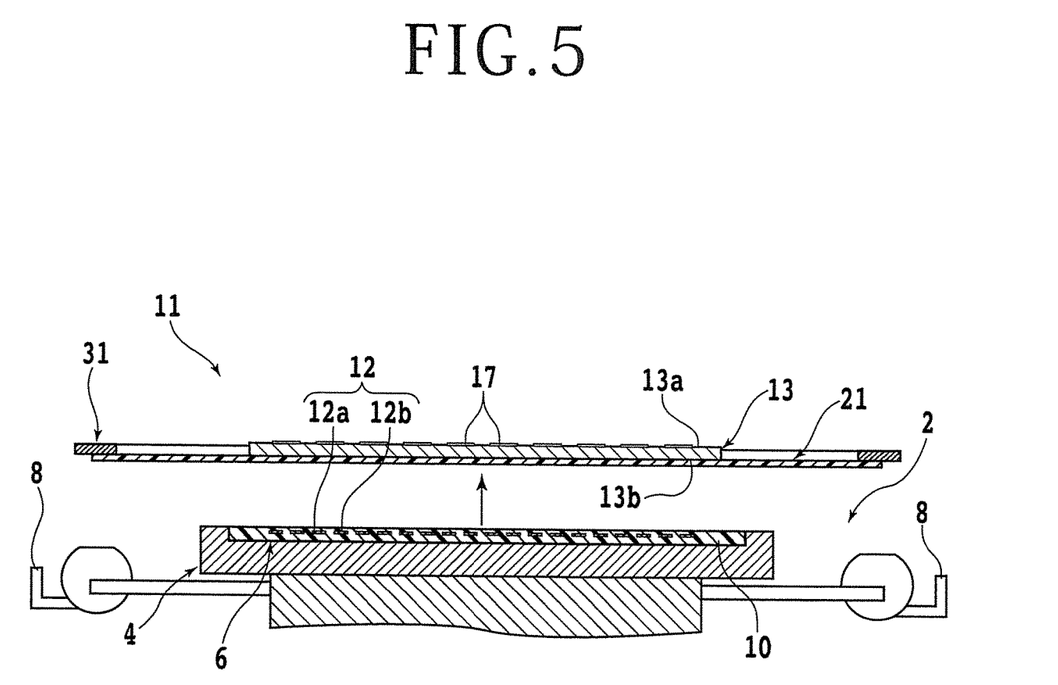
FIG. 5 is a side elevational view, partly in cross section, illustrating an unloading step of the method.

After the attracting step, the unloading step is carried out to unload the workpiece 11 with the sheet 21 attracted thereto from the polarizing table 2. FIG. 5 is a side elevational view, partly in cross section, illustrating the unloading step. In the unloading step, the clamps 8 are turned back to release the frame 31, and the voltages stop being applied to the first electrode pattern 12*a* and the second electrode pattern 12*b*.

As illustrated in FIG. 5, the workpiece 11 with the sheet 21 attracted thereto can now be from the polarizing table 2. At this time, voltages whose polarities are opposite those of the voltages applied in the attracting step may be applied to the first electrode pattern 12*a* and the second electrode pattern 12*b*, making it possible to peel off the sheet 21 easily from the polarizing table 2.

According to the present embodiment, the sheet 21 is made of an insulating material, and the substrate 13 of the workpiece 11 is made of a semiconductor material or an insulating material, as described above. Therefore, even after the workpiece 11 and the sheet 21 together with the frame 31 have been unloaded from the polarizing table 2, the sheet 21 remains attracted to the workpiece 11 for a long period of time, e.g., several days or more.

The unloading step is followed by the dividing step that processes the workpiece 11 with the sheet 21 attracted thereto to divide it into a plurality of device chips. The dividing step includes a modified layer forming step for modifying the inside of the substrate 13 to form modified layers therein along the projected dicing lines 15 and an expanding step for expanding the sheet 21 to break the workpiece 11 from the modified layers as division initiating points into a plurality of device chips.

Figure 6:
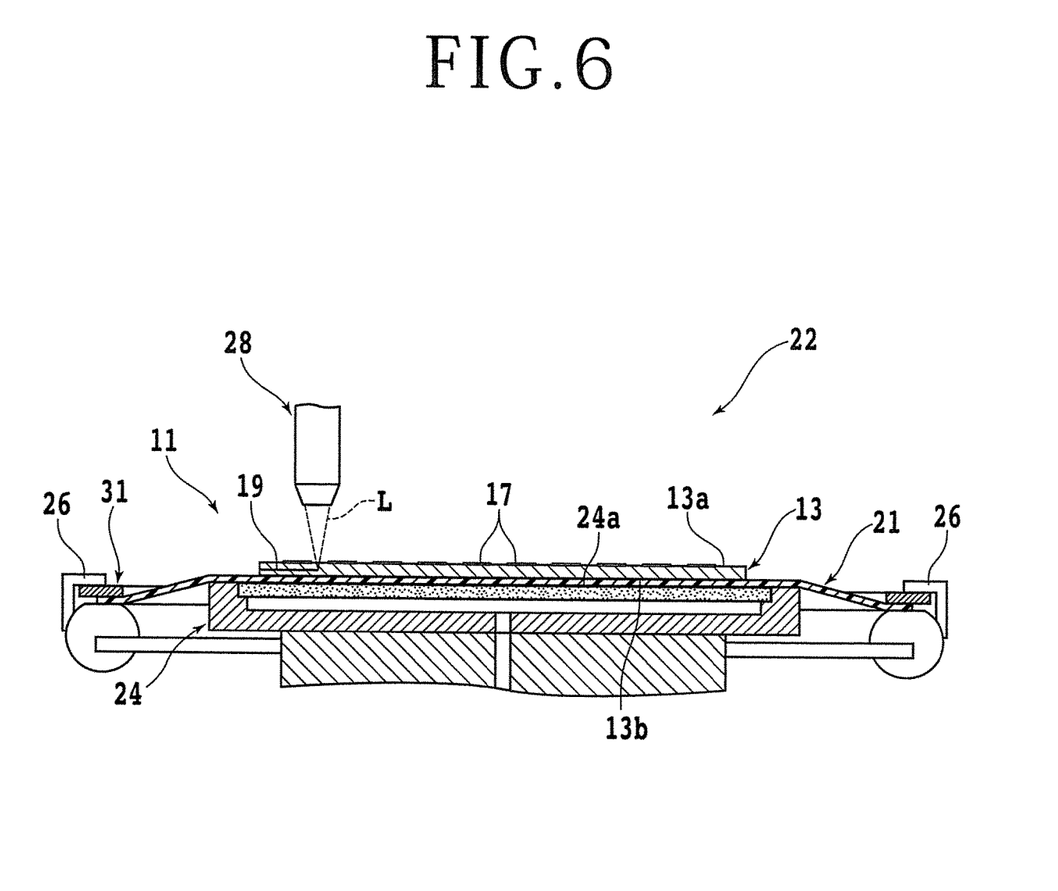
FIG. 6 is a side elevational view, partly in cross section, illustrating a modified layer forming step in a dividing step of the method.

FIG. 6 is a side elevational view, partly in cross section, illustrating the modified layer forming step in the dividing step. The modified layer forming step is carried out using a laser processing apparatus 22 illustrated in FIG. 6, for example. The laser processing apparatus 22 includes a chuck table 24 for sucking and holding the workpiece 11 through the sheet 21.

The chuck table 24 is coupled to a rotary actuator, not depicted, such as an electric motor. The chuck table 24 is rotatable about its own central axis substantially parallel to vertical directions by the rotary actuator. The chuck table 24 is also horizontally movable by a moving mechanism, not depicted, disposed below and connected to the chuck table 24.

The chuck table 24 has an upper surface part of which serves as a holding surface 24*a* for sucking and holding the sheet 21 attracted to the workpiece 11. The holding surface 24*a* is connected to a suction source, not depicted, through a suction channel, not depicted, defined in the chuck table 24. When the suction source is actuated, it develops a negative pressure that acts through the suction channel on the holding surface 24*a*, holding the workpiece 11 on the chuck table 24 through the sheet 21. A plurality of clamps 26 for fixing the frame 31 in position are disposed around the chuck table 24.

The laser processing apparatus 22 also includes a laser applying unit 28 disposed above the chuck table 24. The laser applying unit 28 applies a laser beam L that is pulse-oscillated by a laser oscillator, not depicted, as a focused laser beam spot to a desired position. The laser beam L pulse-oscillated by the laser oscillator has a wavelength that is transmittable through, i.e., hardly absorbable by, the substrate 13 of the workpiece 11.

In the modified layer forming step, the sheet 21, i.e., the lower surface of the sheet 21, attracted to the workpiece 11 is brought into contact with the holding surface 24*a* of the chuck table 24, and the vacuum pressure developed by the suction source is caused to act on the sheet 21. In addition, the clamps 26 are turned to secure the frame 31 in position. The workpiece 11 is now held on the chuck table 24 such that the devices 17, or the face side 13*a* of the substrate 13, are exposed upwardly.

Next, the chuck table 24 is moved and rotated to position the laser applying unit 28 above an extension of a desired one of the projected dicing lines 15, referred to as "target projected dicing line 15," in vertical alignment therewith. Then, as illustrated in FIG. 6, while the laser applying unit 28 is applying the laser beam L to the face side 13*a* of the substrate 13, the chuck table 24 is moved in a direction parallel to the target projected dicing line 15.

The laser beam L is focused on a position in the substrate 13 at a predetermined depth from the face side 13*a* thereof. Since the laser beam L whose wavelength is transmittable through the substrate 13 is focused in the substrate 13 along the target projected dicing line 15, the laser beam L modifies the inside of the substrate 13 at the predetermined depth along the target projected dicing line 15, forming a modified layer 19 that will serve as a division initiating point in the substrate 13.

After the modified layer 19 has been formed in the substrate 13 along the target projected dicing line 15, the chuck table 24 is moved and rotated again, positioning the laser applying unit 28 above an extension of another target projected dicing line 15 in vertical alignment therewith. Then, while the laser applying unit 28 is applying the laser beam L to the face side 13*a* of the substrate 13, the chuck table 24 is moved in a direction parallel to the other target projected dicing line 15.

The above procedure is repeated until modified layers 19 are formed in the substrate 13 along all the projected dicing lines 15, whereupon the modified layer forming step is finished. In the present embodiment, the single modified layer 19 is formed in the substrate 13 along each of the projected dicing lines 15. However, a plurality of modified layers 19 may be formed in the substrate 13 along each of the projected dicing lines 15.

Figure 7A:
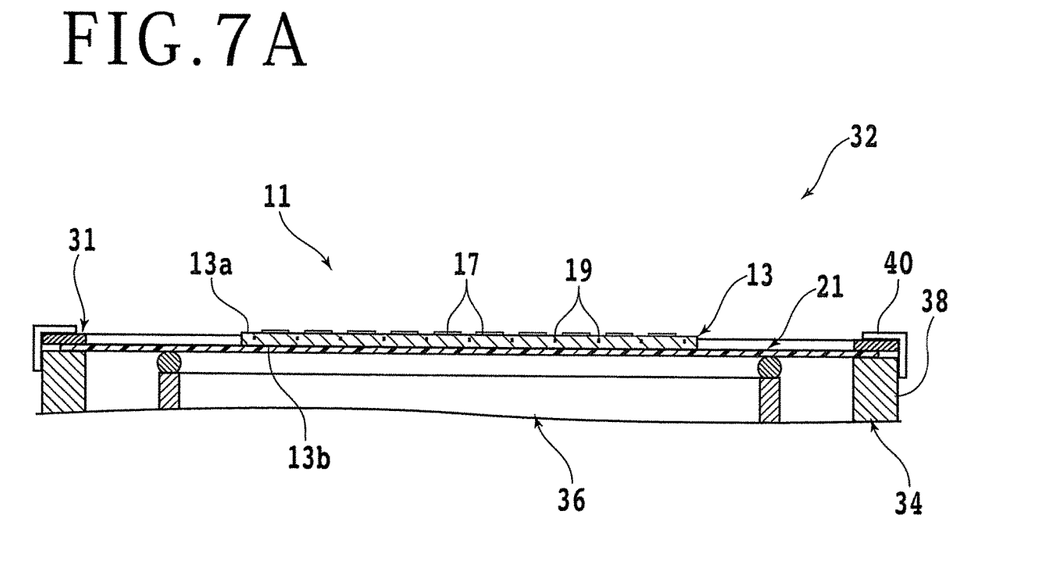
FIGS. 7A and 7B are side elevational views, partly in cross section, illustrating an expanding step in the dividing step.
Figure 7B:
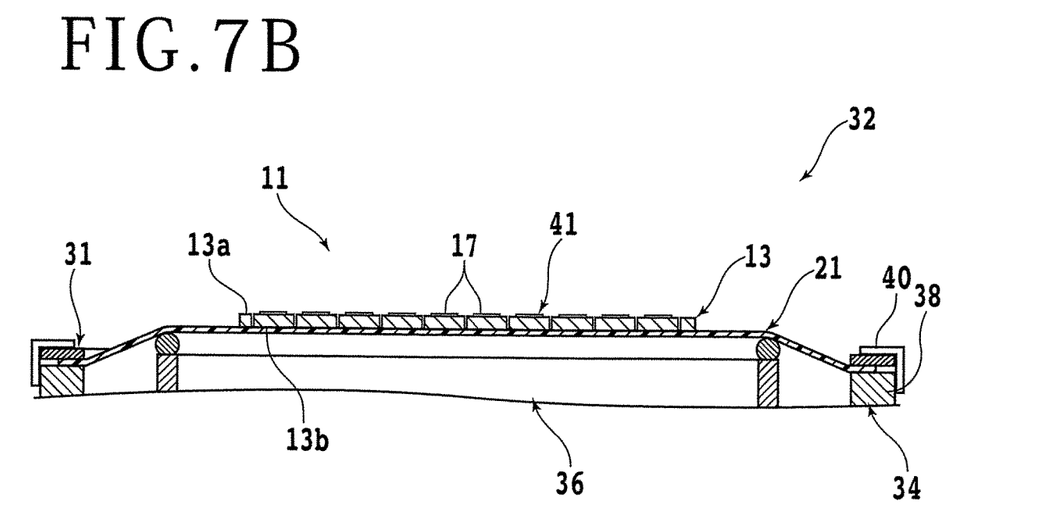

The modified layer forming step is followed by the expanding step. FIGS. 7A and 7B are side elevational views, partly in cross section, illustrating the expanding step in the dividing step. The expanding step is carried out using an expanding apparatus 32 illustrated in FIGS. 7A and 7B, for example. As illustrated in FIGS. 7A and 7B, the expanding apparatus 32 includes a support structure 34 that supports the frame 31 and the outer circumferential edge portion of the sheet 21 thereon and a hollow cylindrical expansion drum 36.

The support structure 34 includes a support table 38 having a circular opening, as viewed in plan, defined therein. The outer circumferential edge portion of the sheet 21 and the frame 31 are placed on an upper surface of the support table 38. A plurality of clamps 40 for fixing the frame 31 and the outer circumferential edge portion of the sheet 21 to the support table 38 are disposed around the support table 38.

The support table 38 is supported by a lifting and lowering mechanism, not depicted, for lifting and lowering the support structure 34. The expansion drum 36 is disposed in the opening of the support table 38. The expansion drum 36 has an inside diameter larger than the diameter of the workpiece 11. The expansion drum 36 has an outside diameter smaller than the inside diameter of the frame 31.

In the expanding step, as illustrated in FIG. 7A, the outer circumferential edge portion of the sheet 21 and the frame 31 are placed on the upper surface of the support table 38 such that the devices 17, or the face side 13a of the substrate 13, are exposed upwardly, and are fixed to the support table 38 by the clamps 40. Before the outer circumferential edge portion of the sheet 21 and the frame 31 are placed on the upper surface of the support table 38, the lifting and lowering mechanism vertically moves the upper surface of the support table 38 to a position at the same height as the upper end of the expansion drum 36 or higher than the upper end of the expansion drum 36.

Then, as illustrated in FIG. 7B, the lifting and lowering mechanism lowers the support structure 34, moving the upper surface of the support table 38 to a position lower than the upper end of the expansion drum 36. As a result, the expansion drum 36 is lifted relatively to the support table 38, pushing the sheet 21 upwardly and hence expanding the sheet 21 radially outwardly. When the sheet 21 is expanded radially outwardly, radial forces directed to expand the sheet 21 act on the workpiece 11, i.e., the substrate 13. The workpiece 11 is now divided into a plurality of device chips 41 from the modified layers 19 that serve as division initiating points.

According to the present embodiment, as described above, the workpiece 11 is placed on the sheet 21 such that an area of the workpiece 11 that corresponds to each of the devices 17 is disposed over an area of the holding surface of the polarizing table 2 where both the first electrode pattern 12a and the second electrode pattern 12b coexist, after which the attracting step is performed. Therefore, the sheet 21 is firmly attracted to the areas that correspond to the respective devices 17 on the workpiece 11, i.e., the areas that correspond to the respective device chips 41.

Consequently, when the sheet 21 is expanded radially outwardly to divide the workpiece 11 into the device chips 41, the workpiece 11 or the device chips 41 are not easily peeled off from the sheet 21. Similarly, after the workpiece 11 has been divided into the device chips 41, the device chips 41 are not easily peeled off from the sheet 21. When the workpiece 11 has been divided into the device chips 41 corresponding to the respective devices 17, the expanding step and the dividing step are finished.

Figure 8:
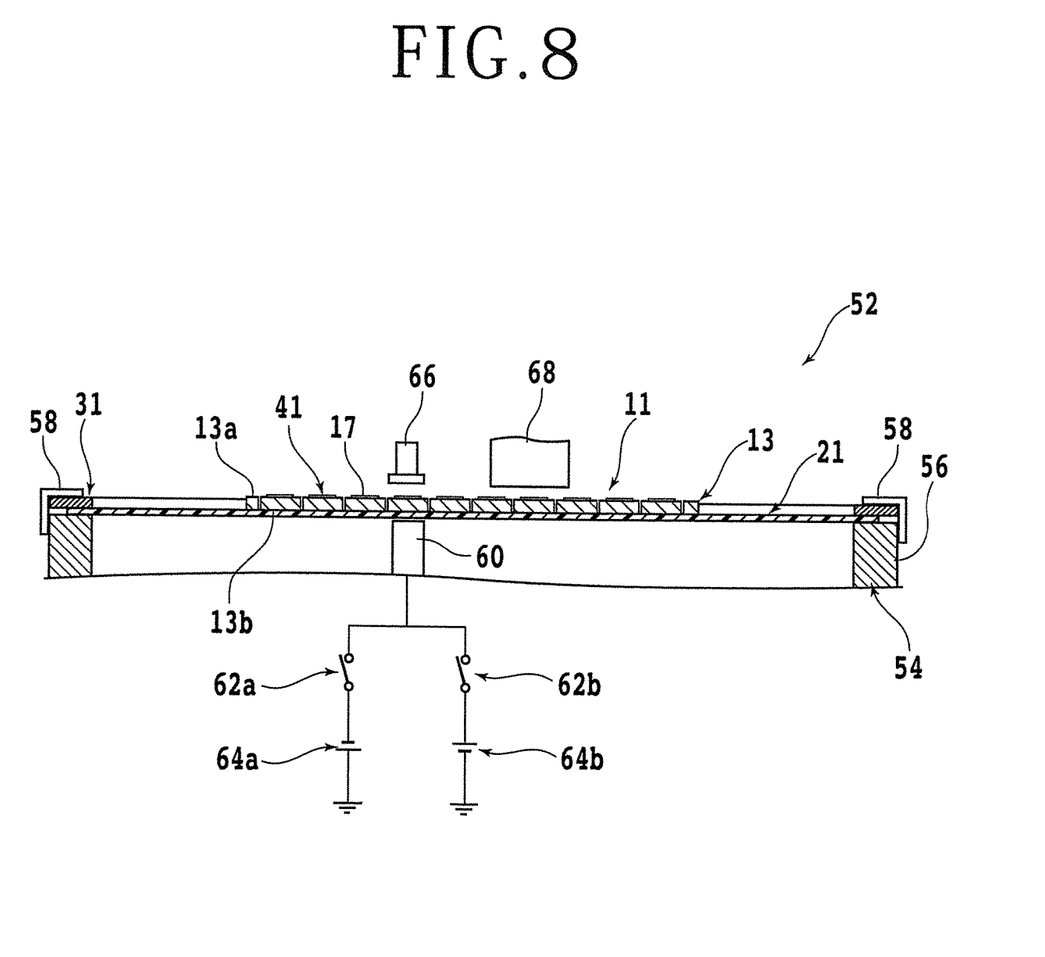
FIG. 8 is a side elevational view, partly in cross section, illustrating a peeling step of the method.

After the dividing step, the peeling step is carried out to release the sheet 21 from the device chips 41, thereby peeling off the device chips 41 from the sheet 21. FIG. 8 is a side elevational view, partly in cross section, illustrating the peeling step. The peeling step is carried out using a pickup apparatus 52 illustrated in FIG. 8. As illustrated in FIG. 8, the pickup apparatus 52 includes a fixing structure or fixing unit 54 for fixing the frame 31 and the outer circumferential edge portion of the sheet 21 in position.

The fixing structure 54 includes a fixing table 56 having a circular opening, as viewed in plan, defined therein. The outer circumferential edge portion of the sheet 21 and the frame 31 are placed on an upper surface of the fixing table 56. A plurality of clamps 58 for fixing the outer circumferential edge portion of the sheet 21 and the frame 31 to the fixing table 56 are disposed around the fixing table 56.

An electrically conductive probe 60 made of an electrical conductor is disposed in the opening of the fixing table 56 at a height aligned with the upper surface of the fixing table 56. The probe 60 has an upper surface that is generally flat for full face-to-face contact with an area of the sheet 21 that corresponds to each of the device chips 41.

The size of the upper surface of the probe 60 is 50% or more, or more preferably 70% or more, of the size of the lower surface of each of the device chips 41, i.e., the reverse side 13b of the substrate 13 that corresponds to each of the device chips 41, for example. As the size of the upper surface of the probe 60 is sufficiently large, an electric field generated by the probe 60 can appropriately act on an area of the sheet 21 that corresponds to each of the device chips 41.

The probe 60 is electrically connected to the negative terminal of a first direct current (DC) power supply 64a through a first switch, i.e., voltage applying unit 62a. The probe 60 is also electrically connected to the positive terminal of a second DC power supply 64b through a second switch, i.e., voltage applying unit 62b. A negative voltage from the first DC power supply 64a and a positive voltage from the second DC power supply 64b can selectively be applied to the probe 60 by selectively turning on and off the first switch 62a and the second switch 62b.

A pickup tool 66 for attracting and picking up one at a time of the device chips 41 from the sheet 21 is disposed above the probe 60. The pickup tool 66 can be moved vertically by a lifting and lowering mechanism, not depicted, for picking up a device chip 41 from the sheet 21 in timed relation to the application of a voltage to the probe 60 that is held in contact with the sheet 21. A camera, i.e., image capturing unit 68 for capturing an image of a device chip 41 to confirm its position is disposed at a position adjacent to the pickup tool 66.

Figure 9A:
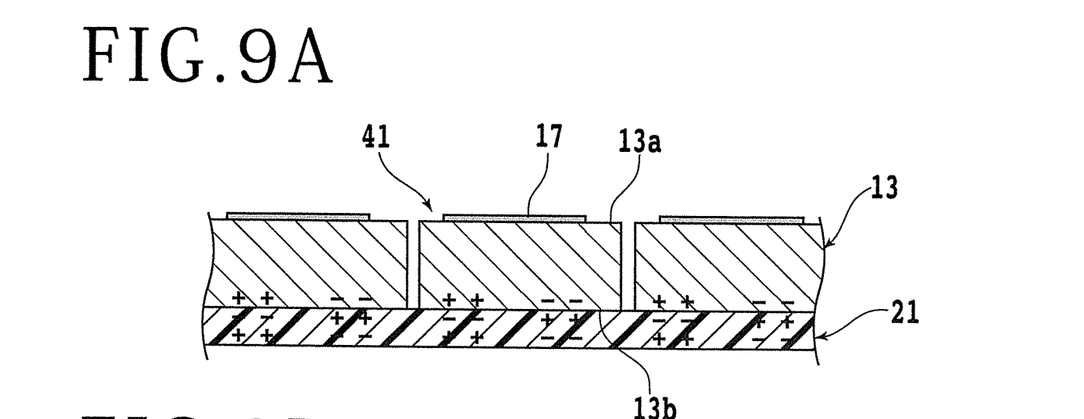
FIG. 9A is an enlarged fragmentary cross-sectional view illustrating the state of the sheet, etc. immediately after the peeling step has started.

In the peeling step, as illustrated in FIG. 8, the outer circumferential edge portion of the sheet 21 and the frame 31 are placed on an upper surface of the fixing table 56 such that the devices 17, or the face side 13a of the substrate 13, are exposed upwardly. FIG. 9A is an enlarged fragmentary cross-sectional view illustrating the state of the sheet 21, etc. immediately after the peeling step has started.

Then, the probe 60 is brought into contact with the area of the lower surface of the sheet 21 which corresponds to one of the device chips 41 that is to be peeled off or picked up. Thereafter, a positive or negative voltage is applied to the probe 60. According to the present embodiment, the first switch 62a is rendered conductive or turned on and the second switch 62b is rendered nonconductive or turned off to apply a negative voltage from the first DC power supply 64a to the probe 60. The sheet 21 is now polarized uniformly in its area that corresponds to the probe 60.

Figure 9B:
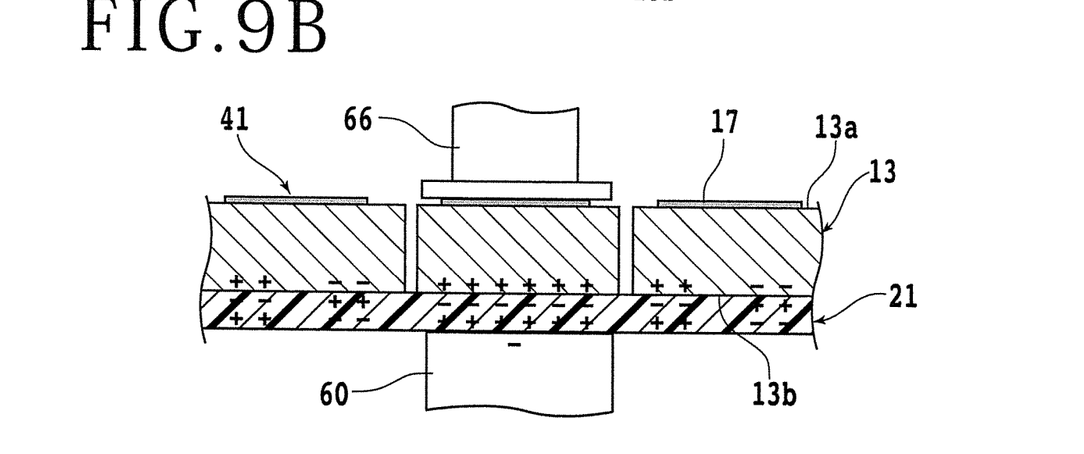
FIG. 9B is an enlarged fragmentary cross-sectional view illustrating the state of the sheet, etc. after a negative voltage has been applied to a probe in the peeling step.

FIG. 9B is an enlarged fragmentary cross-sectional view illustrating the state of the sheet 21, etc. after a negative voltage has been applied to the probe 60 in the peeling step. According to the present embodiment, as illustrated in FIG. 9B, since the negative voltage is applied to the probe 60, the polarization of the sheet 21 is changed in its area corresponding to the probe 60 to develop positive poles therein near the lower surface thereof and negative poles therein near the upper surface thereof.

As the polarization of the sheet 21 is thus changed, the polarization of the device chip 41 to be peeled off is also changed accordingly. Specifically, the device chip 41 is polarized uniformly in its area that corresponds to the probe 60. According to the present embodiment, as illustrated in FIG. 9B, the polarization of the device chip 41 is changed in its area corresponding to the probe 60 to develop positive poles in the substrate 13 near the lower surface thereof.

After the sheet 21 and the device chip 41 have stably been polarized, the other of the positive and negative voltages is applied to the probe 60. According to the present embodiment, the first switch 62a is rendered nonconductive or turned off and the second switch 62b is rendered conductive or turned on to apply a positive voltage from the second DC power supply 64b to the probe 60. The polarities of the poles developed in sheet 21 are now vertically reversed.

Figure 9C:
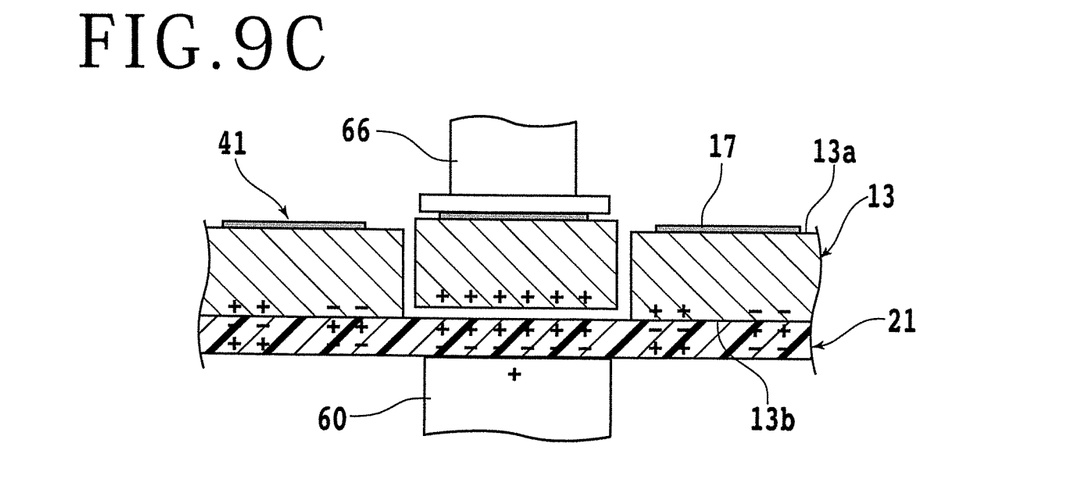
FIG. 9C is an enlarged fragmentary cross-sectional view illustrating the state of the sheet, etc. after a positive voltage has been applied to the probe in the peeling step.

FIG. 9C is an enlarged fragmentary cross-sectional view illustrating the state of the sheet 21, etc. after a positive voltage has been applied to the probe 60 in the peeling step. As illustrated in FIG. 9C, since a positive voltage is applied to the probe 60, the polarization of the sheet 21 is changed in its area corresponding to the probe 60 to develop negative poles in the sheet 21 near the lower surface thereof and positive poles in the sheet 21 near the upper surface thereof.

As a result, the sheet 21 attracted to the device chip 41 is released from the device chip 41 when the polarization of the device chip 41 is changed due to the changed polarization of the sheet 21. Therefore, the device chip 41 can easily be peeled off from the sheet 21 when the pickup tool 66 picks up the device chip 41 in timed relation to the change in the polarization of the sheet 21, i.e., the vertical reversal of the poles in the sheet 21.

Figure 10:
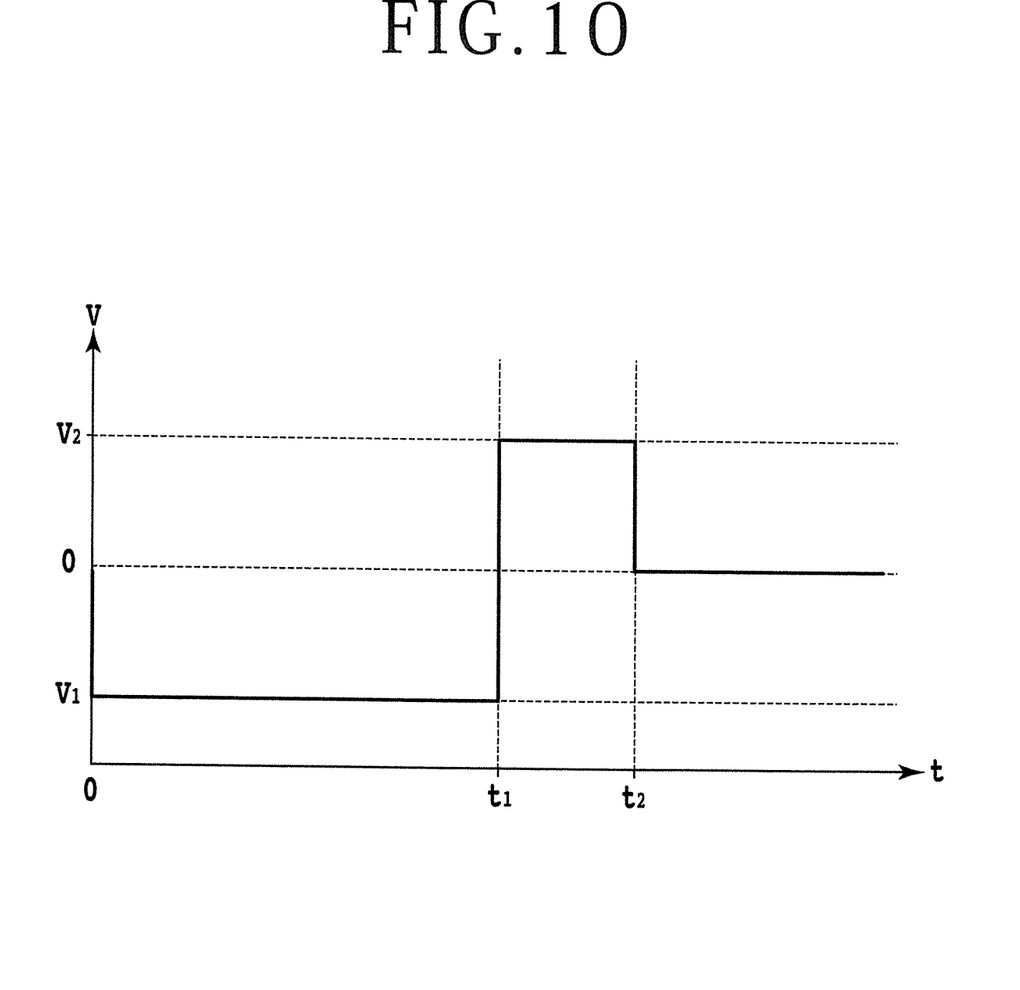
FIG. 10 is a graph illustrating voltages applied to the probe in the peeling step.

FIG. 10 is a graph illustrating voltages applied to the probe 60 in the peeling step. As illustrated in FIG. 10, voltages $V_1$ and $V_2$ that are successively applied to the probe 60 are −3 k V and +3 k V, respectively. The voltage $V_1$ is applied to the probe 60 for a time $t_1$ of three seconds, and the voltage $V_2$ is applied to the probe 60 for a time $(t_2-t_1)$ of one second. However, the voltages $V_1$ and $V_2$ and the times $t_1$, $(t_2-t_1)$ are not limited to the illustrated numerical values.

In the method of manufacturing a plurality of device chips according to the present embodiment, as described above, the workpiece 11 is placed on the polarizing table 2 having the holding surface that includes the pair of electrodes, i.e., the first electrode pattern or electrode 12a and the second electrode pattern or electrode 12b, spaced from each other along in-plane directions, with the insulative sheet 21 being interposed between the workpiece 11 and the polarizing table 2, and thereafter a voltage is applied to the first electrode pattern 12a and the second electrode pattern 12b, polarizing the sheet 21 and the workpiece 11. The sheet 21 is now attracted to the workpiece 11 under electrostatic forces. Therefore, the workpiece 11 can be processed without using the existing adhesive tape to stick the sheet 21 to the workpiece 11.

In the method of manufacturing a plurality of device chips according to the present embodiment, furthermore, inasmuch as an area of the workpiece 11 that corresponds to each of the devices 17 is disposed over an area of the holding surface of the polarizing table 2 where both the first electrode pattern 12a and the second electrode pattern 12b coexist, when a voltage is applied to the first electrode pattern 12a and the second electrode pattern 12b of the polarizing table 2, the sheet 21 is firmly attracted to the area of the workpiece 11 that corresponds to each of the devices 17. Therefore, each of the device chips 41 is not easily peeled off from the sheet 21 when the workpiece 11 is divided into the device chips 41 or after the workpiece 11 has been divided into the device chips 41.

In the method of manufacturing a plurality of device chips according to the present embodiment, moreover, when each of the device chips 41 is to be peeled off from the sheet 21, the electrically conductive probe 60 is brought into contact with the area of the sheet 21 that corresponds to the device chip 41, and a voltage is applied to the probe 60 to cancel the electrostatic attraction between the device chip 41 and the sheet 21. Therefore, the sheet 21 can be released from the device chip 41 when necessary, so that the device chip 41 can easily be peeled off from the sheet 41.

The present invention is not limited to the details of the embodiment described above, and various many changes and modifications may be made therein. The structure and method according to the above embodiment can be changed and modified without departing from the scope of the present invention.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A method of manufacturing a plurality of device chips by dividing a workpiece that includes a substrate made of an insulating material or a semiconductor material and has a face side demarcated into a plurality of areas by a grid of projected dicing lines and a plurality of devices disposed respectively in the areas, comprising the steps of:

placing the workpiece on a table having a holding surface with a pair of electrodes disposed therein that are spaced from each other along in-plane directions, with a sheet of an insulating material being interposed between the workpiece and the table;

thereafter, attracting the sheet to the workpiece under electrostatic forces by applying a voltage between the electrodes in the table to polarize the sheet and the workpiece;

thereafter, unloading the workpiece with the sheet attracted thereto from the table;

thereafter, processing the workpiece with the sheet attracted thereto to divide the workpiece into a plurality of device chips that correspond respectively to the devices; and thereafter, peeling off the device chips from the sheet by bringing an electrically conductive probe into contact with one, at a time, of areas of the sheet that correspond respectively to the device chips, and applying a voltage to the probe thereby to release the sheet from the device chips that have attracted the sheet;

wherein the step of placing the workpiece on a table includes the step of placing the areas of the workpiece that correspond respectively to the devices over an area of the holding surface where the pair of electrodes coexist.

2. The method according to claim 1, wherein the step of peeling off the device chips from the sheet includes the steps of applying one of positive and negative voltages to the probe to change the polarization of the sheet and the device chip, and thereafter applying the other of the positive and negative voltages to the probe to reverse the polarization of the sheet thereby to release the sheet from the device chips that have attracted the sheet.

3. The method according to claim 1,
wherein the step of processing the workpiece comprises the steps of applying a laser beam having a wavelength transmittable through the substrate to the substrate to form modified layers in the substrate along the projected dicing lines, and thereafter expanding the sheet to break the workpiece from the modified layers serving as rupture initiating points thereby to divide the workpiece into the device chips.

4. The method according to claim 2,
wherein the step of processing the workpiece comprises the steps of applying a laser beam having a wavelength transmittable through the substrate to the substrate to form modified layers in the substrate along the projected dicing lines, and thereafter expanding the sheet to break the workpiece from the modified layers serving as rupture initiating points thereby to divide the workpiece into the device chips.

\* \* \* \* \*